United States Patent [19]

Noguchi et al.

[11] Patent Number: 4,562,453
[45] Date of Patent: Dec. 31, 1985

[54] COMPLEMENTARY METAL-OXIDE SEMICONDUCTOR INTEGRATED CIRCUIT DEVICE OF MASTER SLICE TYPE

[75] Inventors: Teruo Noguchi; Isao Ohkura, both of Itami, Japan

[73] Assignee: Mitsubishi Denki Kabushiki Kaisha, Tokyo, Japan

[21] Appl. No.: 440,163

[22] Filed: Nov. 8, 1982

[30] Foreign Application Priority Data

Nov. 25, 1981 [JP] Japan .................... 56-191091

[51] Int. Cl.⁴ .................................... H01L 27/02
[52] U.S. Cl. .................................... 357/44; 357/23.1; 357/41; 357/42; 357/45; 357/46; 357/48
[58] Field of Search ............ 357/45, 23, 44, 41, 357/42, 46, 48

[56] References Cited

U.S. PATENT DOCUMENTS 4,249,193  2/1981  Balyoz et al. .................... 357/45

OTHER PUBLICATIONS

Ashida, Mitsumasa et al., "A 3000-Gate CMOS Masterslice LSI", Proceedings of the 11th Conference on Solid State Devices, Tokyo, 1979; Japanese Journal of Applied Physics, vol. 19, (1980), Supplement 19-1, pp. 203–212.

Primary Examiner—Edward J. Wojciechowicz
Attorney, Agent, or Firm—Lowe, King, Price & Becker

[57] ABSTRACT

A complementary metal-oxide semiconductor master slice integrated circuit comprises a plurality of basic cells (41, 141; 42, 142; ...) in an internal functional gate region (22), each basic cell, which is a basic repetition unit, including a single P-channel metal-oxide semiconductor (41, 42, ...) and a single N-channel metal-oxide semiconductor (141, 142, ...) which are disposed linearly with respect to each other through an electrical isolation region. The plurality of basic cells are equidistantly disposed in parallel in a traverse direction of the internal functional gate region (22), without disposing any electrical isolation regions between the basic cells, so that the positions (101~108, 91~98) where longitudinal wirings are to be placed in a wiring zone (31, 32) correspond to the basic cells in a one-to-one manner. An electrical isolation between a plurality of logical gates structured in the internal functional region is achieved by applying a relatively positive voltage potential and a relatively negative potential to a P-channel metal-oxide semiconductor and an N-channel metal-oxide semiconductor included in the basic cells, respectively. Two metal-oxide semiconductors included in a basic cell are used as a complementary metal-oxide semiconductor by connecting them in a complementary manner, as necessary.

7 Claims, 20 Drawing Figures

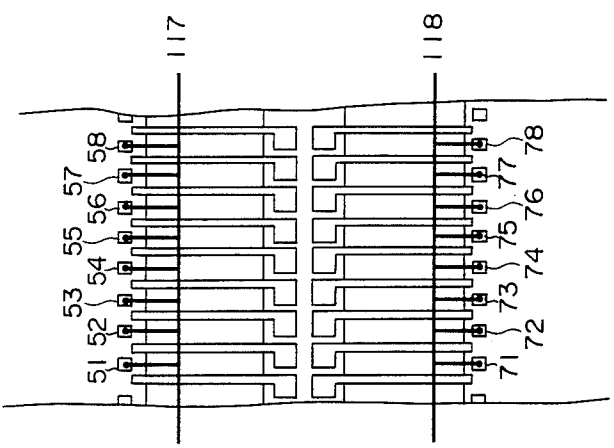
F I G. 20
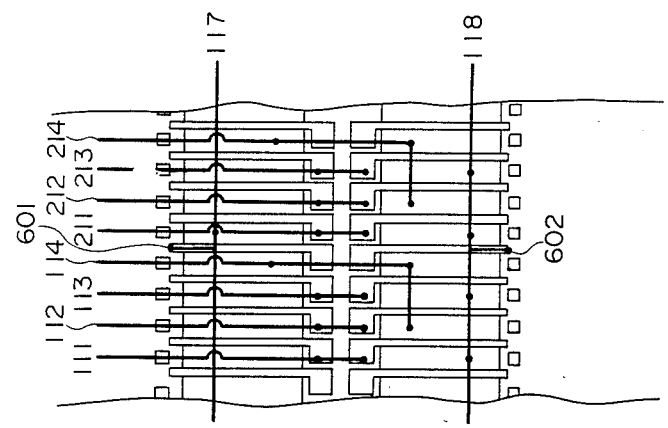
F I G. 18

COMPLEMENTARY METAL-OXIDE SEMICONDUCTOR INTEGRATED CIRCUIT DEVICE OF MASTER SLICE TYPE

BACKGROUND OF THE INVENTION

1. Field of the Invention

The present invention relates to a complementary metal-oxide semiconductor integrated circuit of a master slice type and, more particularly, relates to an arrangement of internal functional gate devices therein.

Master slice type of integrated circuits are classified into a metal-oxide semiconductor type and a bipolar type based on kinds of semiconductors constituting the integrated circuits. From a viewpoint of achieving high integration, a metal-oxide semiconductor type is generally superior to a bipolar type. Further, of metal-oxide semiconductor types, a complementary metal-oxide semiconductor type has an advantage that power to be consumed at the time of high integration is relatively small. Therefore, a complementary metal-oxide semiconductor type tends to be largely used in a master slice type of integrated circuit.

FIG. 1 schematically shows a general chip arrangement of a complementary metal-oxide semiconductor integrated circuit of a master slice type. A rectangular chip 15 comprises in its periphery four peripheral blocks 11, 12, 13 and 14. In the inner regions surrounded by these peripheral blocks, for example, four internal functional gate regions 21, 22, 23 and 24 are disposed, respectively, spaced apart from one another. Regions between the respective internal functional gate regions become wiring zones 31, 32 and 33.

The peripheral blocks are blocks for inputs/outputs interface. In the block, for example, a conversion of signal levels is made. In the internal functional gate regions, circuit elements such as transistors and the like are regularly arrayed. Various kinds of logical gates are structured by properly wiring these circuit elements. Inputs and outputs of the logical gate thus structured are properly connected through wiring in the wiring zones. In such a way, a circuit for achieving a specific operation is made.

FIG. 2 shows in detail an enlarged internal functional gate region 22 as shown in FIG. 1. Referring to FIG. 2, the internal functional gate region and wiring zones will be described in detail. Wiring zones 31 and 32 are formed on both sides of the internal functional gate regions 22. In a portion 10' of the internal functional gate region 22, a logical gate (for example a NOR gate having three inputs) is structured. Four input and output terminals of the logical gate are connected to longitudinal wirings 41, 42, 43 and 44, respectively, within the wiring zone 31. In the wiring zone, lateral wirings (not shown) further exist, other than the longitudinal wirings as shown. However, in general, a longitudinal wiring is used for connecting input/output terminal of a logical gate structured in an internal functional gate region. A position or location where a longitudinal wiring is provided in a wiring zone is predetermined, which is called a longitudinal lattice. In FIG. 2, dotted lines 100 and 90 indicate a longitudinal lattice. For the purpose of simplicity of formation, it is usual that each distance between longitudinal lattices is constant, as shown.

An arrangement of an internal functional gate region in a complementary metal-oxide semiconductor integrated circuit of a master slice type of interest to the present invention is shown in M. Asheda, et al, "A3000-Gate CMOS master slice LSI". Procedings of the 11th Conference on Solid State Device, Tokyo PP. 204–206, 1979. The internal functional gate region in the prior art includes an arrangement as shown schematically in FIG. 3 which is a plan view. In addition, cross sectional views taken in VI—VI line to VIII—VIII line in FIG. 3 are shown, respectively, in FIGS. 4 to 8.

It can be seen that four complementary metal-oxide semiconductors are formed in the internal functional gate region 22 in FIG. 3. Four pairs, each pair comprising a structure including a P-channel metal-oxide semiconductor and an N-channel metal-oxide semiconductor, which structure forms a complementary metal-oxide semiconductor, includes common gates 41, 42, 43 and 44, respectively. Each P-channel type of metal-oxide semiconductor is formed in the upper region in the internal functional gate region 22 (corresponding to the cross section VII—VII). Similarly, each N-channel type of metal-oxide type semiconductor is formed in a lower portion or region of the internal functional gate region 22 (corresponding to the cross section VIII—VIII). The regions 61 and 62 in the upper portion of the internal gate region 22 are source-drain regions of the P-channel metal-oxide semiconductor. The regions 81 and 82 in the lower portion of the internal functional gate region 22 are a source-drain region of the N-channel metal-oxide semiconductor.

Four complementary metal-oxide semiconductors thus structured are divided into two basic cells, that is, basic repetition units. One basic cell comprises a complementary metal-oxide semiconductor having a gate 41 and a complementary metal-oxide semiconductor having a gate 42, and the other basic cell comprises a complementary metal-oxide semiconductor having a gate 43 and a complementary metal-oxide semiconductor having a gate 44. An electrical isolation region and substrate connecting regions 52 and 72 for making an electrical contact with a substrate are provided between two basic cells. In FIG. 3, such electrical isolation region includes all of the regions in the internal functional gate region 22 except for a gate region, source-drain region and substrate connecting regions. Regions 51, 53, 71 and 73 are substrate connecting regions provided between a basic cell as not shown and a basic cell as shown herein.

FIG. 4 is a cross sectional view showing a cross section IV—IV in FIG. 3. A gate 41 is provided on an isolation region 201 for electrically isolating each device. A source-drain diffusion region 61 in a P-channel metal-oxide semiconductor and a source-drain diffusion region 81 in an N-channel metal-oxide semiconductor are provided between isolation regions. A P-type silicon substrate 203 plays a role of a substrate for an N-channel metal-oxide semiconductor. An N-type well diffusion region 202 formed within a P-type silicon substrate 203 plays a role of a substrate for a P-channel metal-oxide semiconductor.

FIG. 5 is a cross sectional view showing a cross section V—V in FIG. 3. The cross sectional view is the same as the cross sectional view of FIG. 4 excluding gate 41.

FIG. 6 is a cross sectional view showing a cross section VI—VI in FIG. 3. In this cross section, substrate connecting regions 52 and 72 are formed between each isolation region 201. The remaining portions are the same as the cross sectional view FIG. 5.

FIG. 7 is a cross sectional view showing a cross section VII—VII in FIG. 3. An N-type well diffusion region 202 formed in a P-type silicon substrate 203 is a substrate for a P-channel type of metal-oxide semiconductor. In FIG. 7, four P-channel type metal-oxide semiconductors are formed. For example, a P-channel metal-oxide semiconductor having a gate 41 is structured by a gate oxide film 204 formed on the substrate 202, a gate 41 formed on the gate oxide film 204 and two source-drain regions 61 formed in the substrate 202 on both sides of the gate region. Further three P-channel metal-oxide semiconductors are structured by the same manner. These four metal-oxide semiconductors are divided into two basic cells by the substrate connecting region 52 and the electric isolation region 201.

FIG. 8 is a cross sectional view showing a cross section VIII—VIII in FIG. 3. In this cross section, four N-channel metal-oxide semiconductors are provided, which become complementary to four P-channel metal-oxide semiconductors provided in FIG. 7.

Returning to FIG. 3, there are a plurality of longitudinal lattices in the wiring zones 31 and 32, as shown in dotted lines. The longitudinal lattices are provided equidistantly to correspond to gate, source, drain regions in the internal functional gate region 22.

Now, referring to FIG. 9, a wiring arrangment is illustrated where a logical gate is structured in the internal functional gate region as shown in FIG. 3. In this example, a three-input NOR gate comprising three input terminals 111, 112 and 113 and an output terminal 114, as shown in FIG. 10, is structured. Solid lines 111-118 indicate wirings. Solid points in the wiring mean that the wirings are electrically connected to a region thereunder. Wirings 111-114 in the wiring zone 31 are longitudinal wiring for connecting inputs and output of the three-input NOR gate shown by FIG. 10, which are denoted in the same reference numerals as those of the wirings 111-114. These longitudinal wirings are disposed on the longitudinal lattices as shown in dotted lines.

A three-input NOR gate comprises four terminals. Thus, only four longitudinal lattices are needed for longitudinal wiring. However, the three-input NOR gate as structured herein spans five longitudinal lattices 102-106. The reason is that the longitudinal lattice 105 is not effectively utilized. The longitudinal lattice 105 corresponds to an isolation region (and a substrate connecting region) between basic cells. Accordingly, the longitudinal lattice 105 can never be used as a longitudinal wiring for input and output of the logical gate.

Furthermore, the three-input NOR gate is structured by three metal-oxide semiconductors. Thus, there is one metal-oxide semiconductor too many in one basic cell. However, since this metal-oxide semiconductor is not electrically isolated from another metal-oxide semiconductor in the same basic cell, it can not be utilized for constituting other logical gate.

Thus, according to the internal functional gate region of the prior art, an internal functional gate region corresponding to the longitudinal lattices 102-108 was needed for constituting a three-inputs NOR gate. However, the region effectively utilized is merely a region corresponding to the longitudinal lattices 102, 103, 104 and 106. The internal functional gate region of a conventional complementary metal-oxide semiconductor master slice integrated circuit comprises basic cells each comprising more than one complementary metal-oxide semiconductors and isolation regions for electrically isolating between each basic cell. Therefore, the above described problems necessarily arise. This is a big obstacle for high integration of integrated circuit.

SUMMARY OF THE INVENTION

The present invention is directed to an arrangement of an internal functional gate region of a complementary metal-oxide semiconductor master slice integrated circuit. A single P-channel metal-oxide semiconductor and a single N-channel metal-oxide semiconductor which are disposed linearly with respect to each other through an electrical isolation region constitute a basic cell, that is, a basic repetition unit. A plurality of basic cells are arranged in a traverse direction of the internal functional gate region, without disposing any electrical isolation regions between the basic cells, so that the positions where wirings are to be placed in a wiring zone adjacent to the internal functional gate region correspond to the basic cells, respectively, in a one-to-one manner in a longitudinal direction of the basic cells.

In a preferred embodiment of the present invention, the basic cells are disposed equidistantly. Accordingly, the positions where longitudinal wirings are to be placed are located equidistantly. Any of the basic cells is used as an electrical isolation region by applying a relatively positive voltage potential and a relatively negative voltage potential to a P-channel metal-oxide semiconductor and an N-channel metal-oxide semiconductor included therein, respectively. The plurality of basic cells includes a P-channel metal-oxide semiconductor substrate connecting region which makes an electrical contact with a substrate of a P-channel metal-oxide semiconductor, and an N-channel metal-oxide semiconductor, substrate connecting region which makes an electrical contact with a substrate of the N-channel metal-oxide semiconductor, respectively. A relatively positive voltage potential is applied to the P-channel metal-oxide semiconductor substrate connecting region and a relatively negative voltage potential is applied to the N-channel metal-oxide semiconductor substrate connecting region, so that the potentials of the substrate are fixed, respectively.

Accordingly, the principal object of the present invention is to make possible a high integration of a complementary metal-oxide semiconductor master slice integrated circuit by improving an arrangement of an internal functional gate region therein.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 18 shows an example of wiring in case where two logical gates are structured in the internal functional gate region shown in FIG. 11;

FIG. 20 illustrates a manner of fixing a substrate voltage potential in the preferred embodiment of the present invention as shown in FIG. 11.

DETAILED DESCRIPTION OF THE PREFERRED EMBODIMENTS

Figure 11:
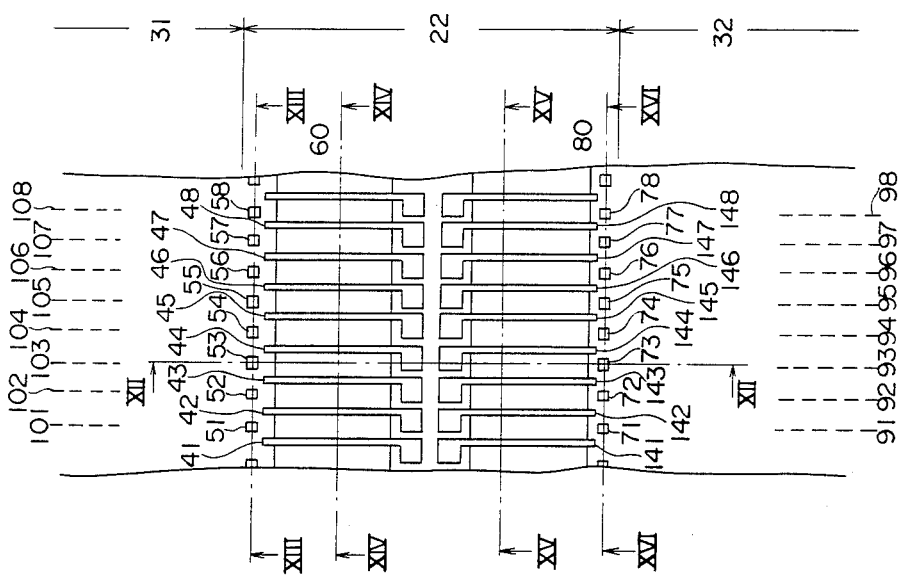
FIG. 11 is a plan view schematically showing an internal functional gate region of a complementary metal-oxide semiconductor master slice integrated circuit in accordance with a preferred embodiment of the present invention.

FIG. 11 is a plan view schematically showing an internal functional gate region of a complementary metal-oxide semiconductor master slice integrated circuit of a preferred embodiment in accordance with the present invention. FIGS. 12 to 16 show cross sectional views taken along lines XII—XII to XVI—XVI in FIG. 11.

Referring to FIG. 11, a preferred structure of an internal functional gate region of a complementary metal-oxide semiconductor master slice integrated circuit in accordance with the present invention will be described. Nine P-channel metal-oxide semiconductors and nine N-channel metal-oxide semiconductors are formed in the internal functional gate region 22. The number of metal-oxide semiconductors can be increased or decreased, as necessary. The metal-oxide semiconductors formed in the upper portion in the internal functional gate region 22 (corresponding to cross section XIV—XIV) are of P-channel type and the metal-oxide semiconductors formed in the lower portion of the internal functional gate region 22 (corresponding to cross section XV—XV) are of N-channel type. A single complementary metal-oxide semiconductor comprises a pair of a single P-channel metal-oxide semiconductor in the upper portion and a single N-channel metal-oxide semiconductor in the lower portion which is opposed to the P-channel metal-oxide semiconductor. Accordingly, by way of illustration of FIG. 11, nine complementary metal-oxide semiconductors can be formed.

The pair of a P-channel metal-oxide semiconductor and an N-channel metal-oxide semiconductor which constitute a complementary metal-oxide semiconductor is different from that in the above described prior art in that the gates are not common to each other in the embodiment. This is particularly needed for eliminating necessity of providing in advance electrical isolation regions between basic cells and, is one of the important features of the present invention. This will be subsequently described in conjunction with FIG. 18. Connecting regions, for wiring for gates, provided in a middle portion of the internal functional gate region 22 are separated into a region for gates 41–49 of the P-channel metal-oxide semiconductors and a region for the gates 141–149 of the N-channel metal-oxide semiconductors.

A region 60 within the upper portion of the internal functional gate region 22 is a source-drain region of P-channel metal-oxide semiconductors. A region 80 within the lower portion of the internal functional gate region 22 is a source-drain region of N-channel metal-oxide semiconductors. In such a way, nine P-channel metal-oxide semiconductors and nine N-channel metal-oxide semiconductors are formed.

In an arrangement of the internal functional gate region of a complementary metal-oxide semiconductor in accordance with the present invention, as shown in FIG. 11, a single complementary metal-oxide semiconductor becomes a basic cell or a basic repetition unit, which is different from that in the prior art. In addition, no region for electrical isolation (and no substrate connecting region) exist between each of basic cells. This is needed for structuring logical gates without leaving complementary metal-oxide semiconductors, and is one of the important features of the present invention. This will be subsequently described in conjunction with FIG. 17.

Substrate connecting regions for electrically connecting a substrate are provided on an extremely upper portion and an extremely lower portion of the internal functional gate region 22, corresponding to each basic cell. More particularly, the regions 51–58 and regions 71–78 indicate substrate connecting regions. An arrangement of these connecting regions is not so important to the present invention. For example, a stripe of substrate connecting region common to each of basic cells may be provided.

Figure 12:
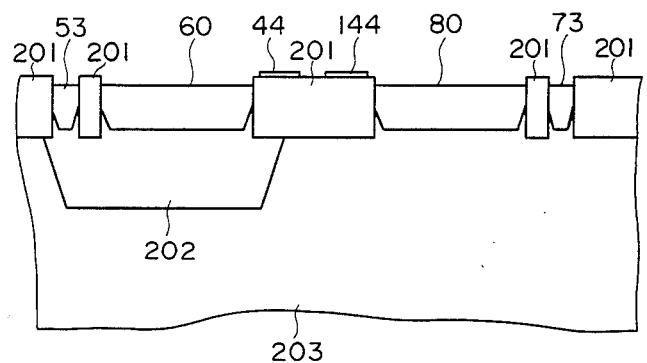
FIGS. 12 to 16 are cross sectional views showing cross sections along lines XII—XII to XVI—XVI in FIG. 11.

Now, referring to FIGS. 12 to 16, the structure of the internal functional gate region as shown in FIG. 11 will be described. FIG. 12 is a cross sectional view along line XII—XII in FIG. 11. A P-type silicon substrate 203 plays a role of a substrate for an N-channel type metal-oxide semiconductor. An N-type well diffusion region 202 formed in the P-type silicon substrate 203 serves as a substrate for P-channel type of metal-oxide semiconductor. A source-drain region 60 in the P-channel metal-oxide semiconductor formed in the N-type well diffusion region 202 and a source-drain region 80 in the N-channel metal-oxide semiconductor formed in the P-type silicon substrate are separated by a central isolation region 201 for isolating the elements. A gate 44 of P-channel metal-oxide semiconductor and a gate 144 of the N-channel metal oxide semiconductor are formed on the central isolation regions. These gates are separated with respect to each other. The gate region as shown herein is a connecting region for wiring four gates. A substrate connecting region 53 is electrically isolated from the source-drain region 60 of the P-channel metal-oxide semiconductor by the isolation region 201 and is formed within the N-type well diffusion region 202. A substrate connecting region 73 is electrically isolated from the source-drain region 80 of the N-channel metal-oxide semiconductor by the isolation region 201 and is formed within the P-type silicon substrate 203. The substrate connecting regions 53 and 73 make electrical contact with the substrate thereunder.

Figure 13:
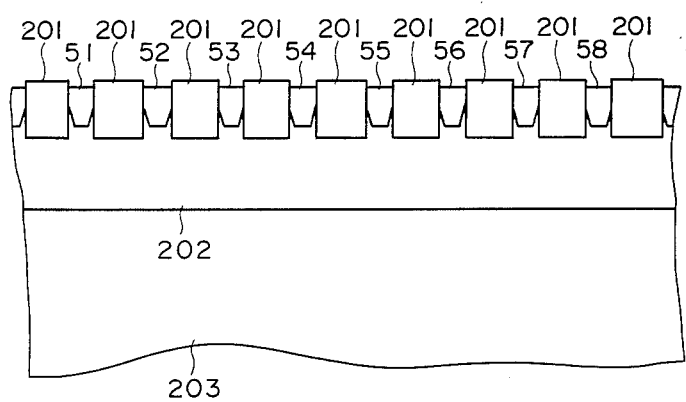

FIG. 13 is a cross sectional view along line XIII—XIII in FIG. 11. In the cross sectional view, substrate connecting regions 51–58 are formed within the N-type well diffusion region 202 formed in the P-type silicon substrate 203. Each of substrate connecting regions 51–58 are electrically isolated by the isolation region 201. However, this isolation is substantially meaningless since each of the connecting regions makes contact with the same substrate.

Figure 1:
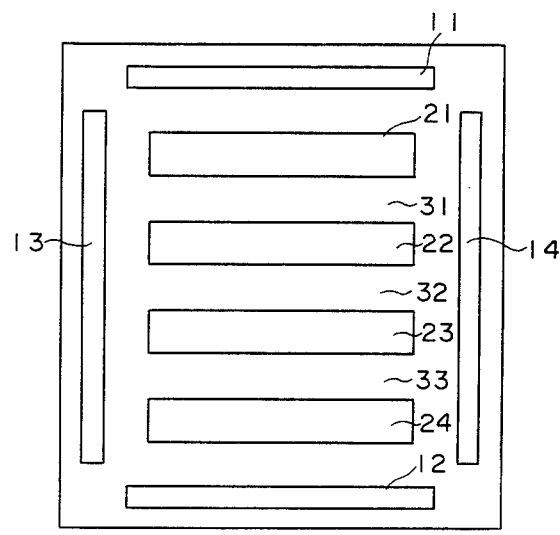
FIG. 1 is a schematic illustration schematically showing a general chip structure of a complementary metal-oxide semiconductor master slice integrated circuit.
Figure 2:
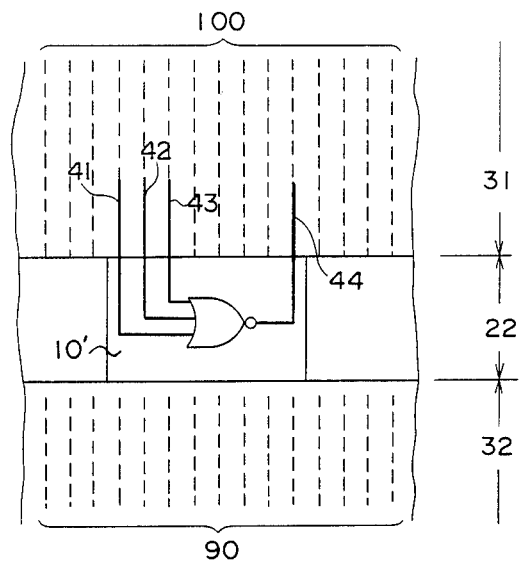
FIG. 2 is an enlarged drawing of an internal functional gate region.
Figure 9:
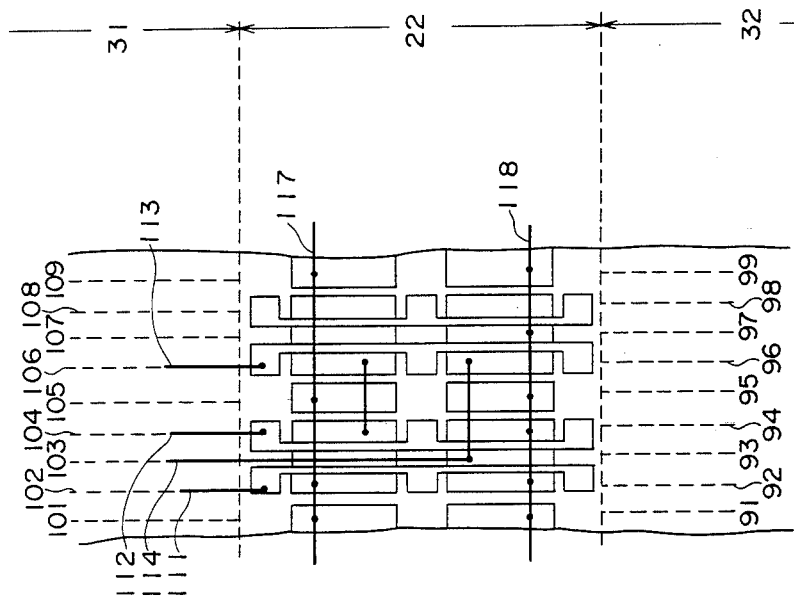
FIG. 9 shows an example of a wiring in case where a logical gate is structured in the internal functional gate region as shown in FIG. 3.
Figure 3:
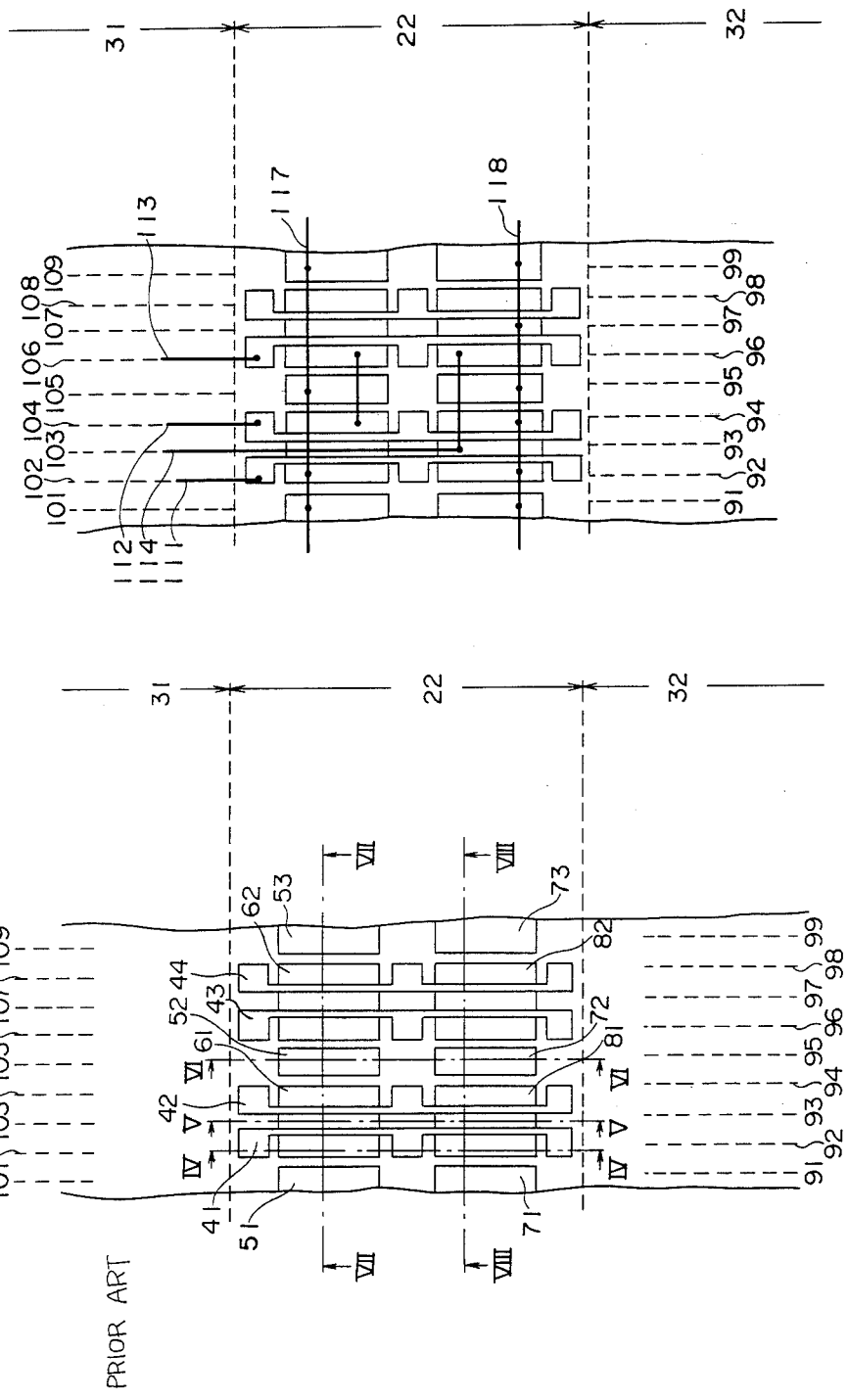
FIG. 3 is a plan view schematically showing a structure of an internal functional gate region of the prior art.
Figure 4:
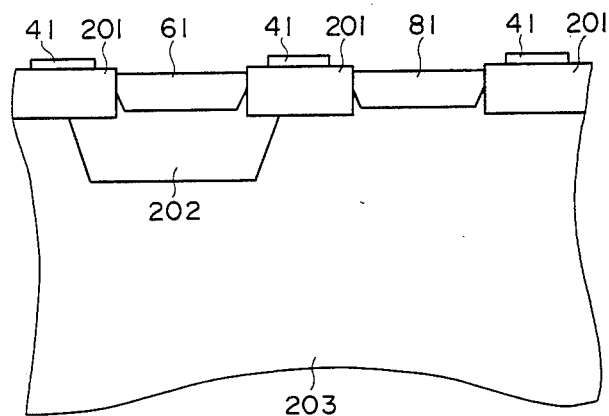
FIGS. 4 to 8 are cross sectional views showing cross section along lines IV—IV to VIII—VIII in FIG. 3, respectively.
Figure 5:
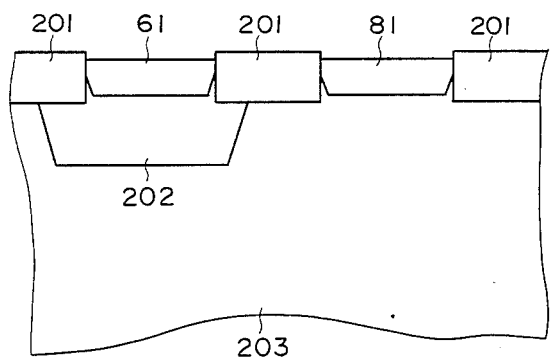
Figure 6:
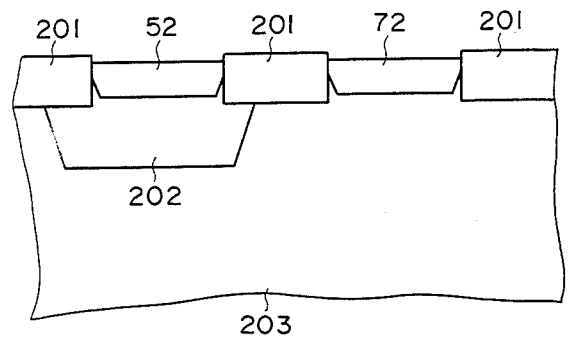
Figure 7:
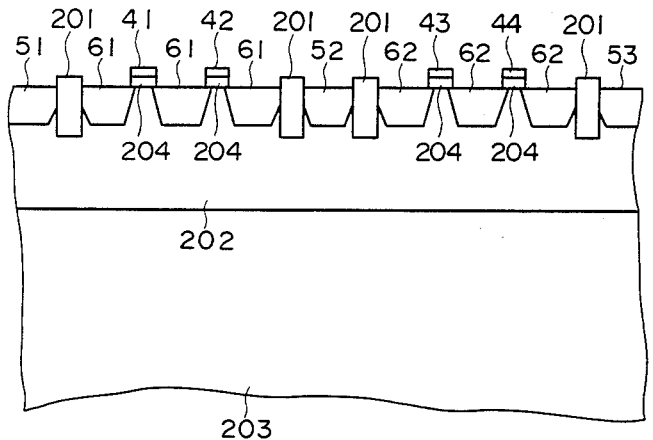
Figure 8:
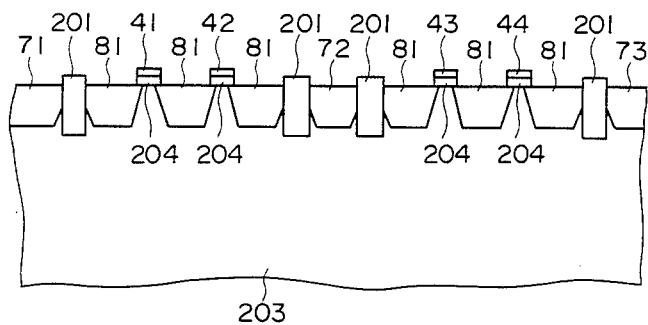
Figure 14:
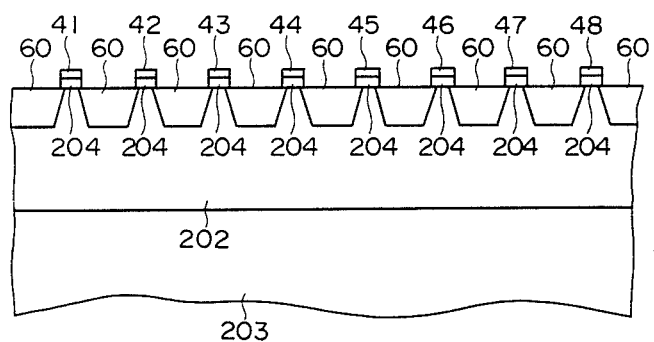

FIG. 14 is a cross sectional view along line XIV—XIV in FIG. 11. A gate oxide film 204 is formed on the N-type well diffusion region 202 formed within the P-type silicon substrate 203 and gates 41–48 of the P-channel metal-oxide semiconductor are formed over the film 204. A source-drain region 60 of the P-channel metal-oxide semiconductor are formed between each of the gate regions and within the N-type well diffusion region 202. In the cross sectional view, eight P-channel metal-oxide semiconductors are shown, each metal-oxide semiconductor being not electrically isolated. More particularly, a single metal oxide semiconductor is a basic cell and no electrical isolation region and no substrate connecting region, which are provided in the above described prior art, exist between each basic cell (refer to FIG. 7).

Figure 15:
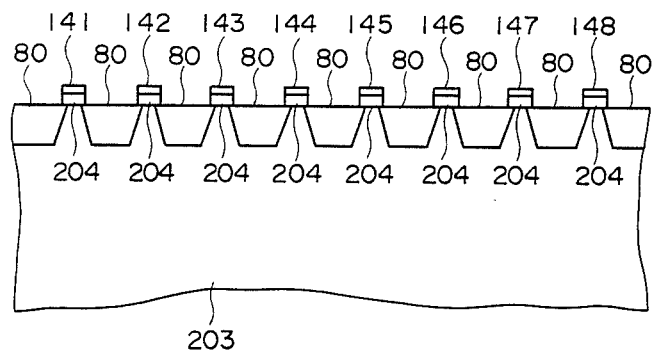

FIG. 15 is a cross sectional view along line XV—XV in FIG. 11. In the cross sectional view, N-channel metal-oxide semiconductors are formed on a P-type silicon substrate 203. Eight N-channel metal-oxide semiconductors shown herein can form eight complementary metal-oxide semiconductors, together with eight P-channel metal-oxide semiconductors shown in FIG. 14.

Figure 16:
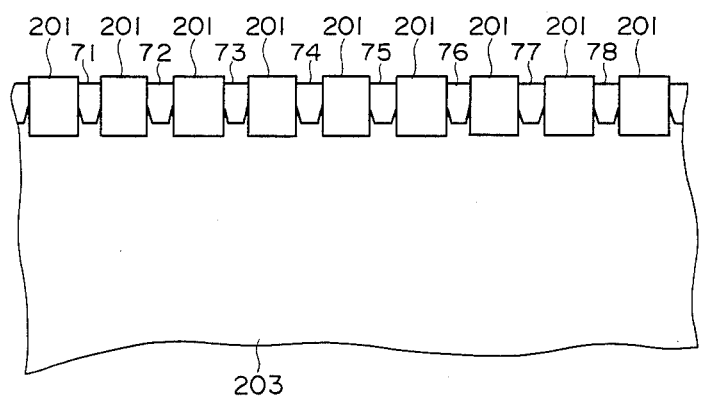

FIG. 16 is a cross sectional view showing a cross section along line XVI—XVI in FIG. 11. The cross sectional view corresponds to the cross sectional view of line XIII—XIII shown in FIG. 13. Each of connecting regions 71–78 makes electrical contact with the P-type silicon substrate 203.

Returning to FIG. 11, a plurality of longitudinal lattices are formed in wiring zones 31 and 32, as shown in dotted lines 101–108 and 91–98, respectively. These longitudinal lattices correspond to the basic cells in the internal functional gate region 22 and are equidistantly disposed. More particularly, the width of the basic cell and the pitch between each longitudinal lattice coincide with each other.

Figure 10:
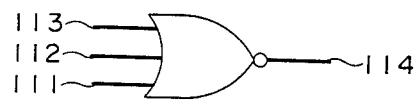
FIG. 10 is a three-input NOR gate structured in the internal functional gate region as shown in FIG. 9.
Figure 17:
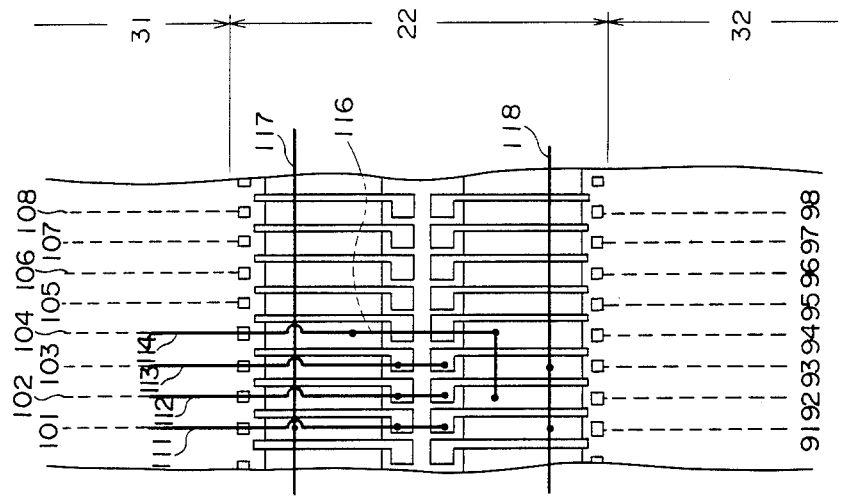
FIG. 17 illustrates a wiring in case where a three-input NOR gate as shown in FIG. 12 is structured in the internal functional gate region shown in FIG. 11.

Returing to FIG. 17, there is shown a wiring in case where a three-input NOR gate as shown in FIG. 10 for example, is structured in the internal functional gate region 22. The solid lines 111–118 indicate wirings. Solid circles in the wirings mean that the wirings are electrically connected to the region thereunder. The wirings 111–114 in the wiring zone 31 are longitudinal wirings for connecting inputs and output of the three-inputs NOR gate in FIG. 10. These longitudinal wirings are disposed on the longitudinal lattices shown in dotted lines.

The three-input NOR gate is formed between four longitudinal lattices 101–104. The basic cells corresponding to these four longitudinal lattices are all effectively utilized for the following two reasons. First, isolation regions between each basic cell are eliminated, so that unnecessary isolation regions are not included in a logical gate even if the logical gate is structured by more than two basic cells. Secondly, a basic cell comprises only one complementary metal-oxide semiconductor so that it never occurs that only a partial complementary metal oxide semiconductor in a basic cell is used.

In the internal functional gate region of the complementary metal-oxide semiconductor master slice integrated circuit in accordance with the present invention, P-channel metal-oxide semiconductors and N-channel metal-oxide semiconductors are separately formed, as described in the foregoing. Pairs of P-channel metal-oxide semiconductors and N-channel metal oxide semiconductors constituting complementary metal oxide semiconductors are connected to each other, as necessary, by interconnecting their gates by suitable wiring. Refer to gates corresponding to longitudinal lattices 101, 102 and 103 in FIG. 17.

Figure 19:
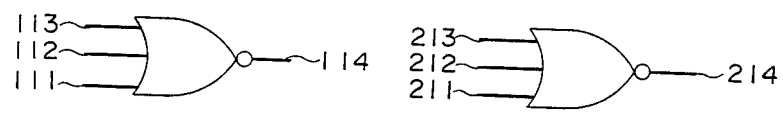
FIG. 19 shows two three-input NOR gates structured in FIG. 18.

Such separate formation of P-channel metal-oxide semiconductors and N-channel metal-oxide semiconductors is associated with elimination of isolation regions between each basic cell. This will be described in the following in conjunction with FIG. 18. FIG. 18 shows a manner of achieving an electrical isolation between logical gates in case where a plurality of logical gates are structured in the internal functional gate region 22. In this example, two three-input NOR gates as shown in FIG. 19 are structured adjacent to each other. One three-input NOR gate corresponds to longitudinal wirings 111–114 and the other three-inputs NOR gate corresponds to longitudinal wirings 211–214. The wiring 117 is a wiring for a positive voltage source and the wiring 118 is a wiring for ground voltage. A pair of a P-channel metal-oxide semiconductor 601 and an N-channel metal-oxide semiconductor 602 which are provided between two three-input NOR gates are kept isolated and thus does not constitute a complementary metal-oxide semiconductor. In addition, the gate of the P-channel metal oxide semiconductor 601 is connected to a positive voltage wiring 117 so that the gate is fixed to a positive voltage potential. On the other hand, the gate of the N-channel metal-oxide semiconductor 602 is connected to a ground voltage wiring 118 so that gate is fixed to a ground potential. Accordingly, these metal-oxide semiconductors 601 and 602 are rendered non-conductive. In such a way, an electrical isolation between two three-input NOR gates is achieved.

In general, in a complementary metal-oxide semiconductor integrated circuit, a latch-up phenomenon due to a parasitic bipolar transistor is often raised as a serious problem. Such latch-up phenomenon is caused by the fact that the substrate potential of the N-channel metal-oxide semiconductor becomes higher than a ground potential of a voltage source or the substrate potential of the P-channel metal oxide semiconductor becomes lower than the positive voltage potential due to charges introduced into a bulk because of some reasons. Thus, in order to prevent such a latch-up phenomenon, it has been proposed that a substrate potential of a metal-oxide semiconductor is fixed to a positive voltage potential or a ground voltage potential. According to the above described embodiment of the present invention, a manner of fixing a substrate potential is shown in FIG. 20. In FIG. 20, each of substrate connecting regions 51–58 in the P-channel regions is connected to the positive voltage potential wiring 117, respectively. Thus, the substrate of the P-channel metal-oxide semiconductors is fixed at a positive voltage potential. Each of the substrate connecting regions 71–78 in the N-channel regions is connected to a ground voltage potential 118. In such a way, the substrate of the N-channel metal-oxide semiconductor is fixed in the ground voltage potential.

As described in the foregoing, according to the present invention, in a complementary metal-oxide semiconductor integrated circuit comprising a gate array arrangement including an internal functional gate region and wiring zones adjacent thereto, longitudinal lattices in the wiring zones are made to correspond to basic cells in the internal functional gate region in a one-toone manner. Accordingly, all of the longitudinal lattices can be utilized as longitudinal wirings for input-output of logical gates structured in the internal functional gate region. This particularly makes it possible to enhance high integration of a complementary metal-oxide semiconductor master slice integrated circuit.

The present invention can be used in an integrated circuit having a gate array arrangement in a portion of a chip and an integrated circuit having a stored memory type of gate array, as well as an integrated circuit having a gate array arrangement in the entire region of a chip. And the present invention is available on the structure of a complementary metal-oxide semiconductor structure by using N-type well complementary metal-oxide semiconductor technology.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A complementary metal-oxide semiconductor master slice integrated circuit having at least a gate array arrangement of a master slice type, comprising an internal functional gate region (22) for structuring logical gates and wiring zones (31, 32) adjacent to said internal functional gate region (22) in which positions (91~98, 101~108) where inputs and outputs of said logical gates are to be wired are predetermined, comprising a plurality of basic cells (41, 141; 42, 142; ...) formed in said internal functional gate region (22), each basic cell comprising a single P-channel metal-oxide semiconductor (41, 42, ...) and a single N-channel metal oxide semiconductor (141, 142, ...) which are arrayed in a linear manner throughout an electrical isolation region, said plurality of basic cells (41, 141; 42, 142; ...) being disposed in a transverse direction of said internal functional gate region (22), without disposing any electrical isolation regions therebetween, so that said positions (91~98, 101~108) in said wiring zones (31, 32) define said basic cells in a one-to-one manner in a longitudinal direction or a transverse direction of said internal functional gate region (22).

2. A complementary metal-oxide semiconductor master slice integrated circuit in accordance with claim 1, including means for applying, respectively, a relatively positive voltage potential (117) and a relatively negative voltage potential (118) to a P-channel metal-oxide semiconductor and to an N-channel metal-oxide semiconductor included in any of said plurality of basic cells (41, 141; 42, 142; ...), so that any of said plurality of basic cells can be used as an electrical isolation region.

3. A complementary metal-oxide semiconductor master slice integrated circuit in accordance with claim 1 or 2, wherein said plurality of basic cells (41, 141; 42, 142; ...) further comprises a P-channel metal-oxide semiconductor substrate connecting region (51~58) which makes an electrical contact with a substrate for said P-channel metal-oxide semiconductor, and an N-channel metal-oxide semiconductor substrate connecting region making (71~78) an electrical contact with a substrate for said N-channel metal-oxide semiconductor, respectively, together with means for applying a positive potential (117) to said P-channel metal oxide semiconductor substrate connecting region (57~58) and a negative voltage (118) to said N-channel metal-oxide semiconductor substrate connecting region (71~78), so that potentials of the substrates are fixed, respectively.

4. A complementary metal-oxide semiconductor master slice integrated circuit having at least a gate array arrangement of a master slice type, comprising an internal region for structuring logical gates and wiring zones adjacent to said internal region and having a lattice structure incorporating a plurality of substantially parallel lattices defining positions where inputs and outputs of said logical gates are to be wired are predetermined, comprising a plurality of basic cells each having a width corresponding to and defined by a distance between said lattices, said cells formed in said internal region, independently of electrical isolation regions therebetween, each basic cell comprising a single P-channel metal-oxide semiconductor having a source-drain region and an overlying gate region together with a single N-channel metal-oxide semiconductor having a source-drain region and an overlying gate region, said N-channel and P-channel metal-oxide semiconductors arrayed linearly in a functional gate region.

5. A complementary metal-oxide semiconductor master slice integrated circuit as recited in claim 4 comprising means for providing predetermined voltage levels to a P-channel metal-oxide semiconductor and to a corresponding N-channel metal-oxide semiconductor for providing one of said plurality of basic cells as an isolation between adjacent circuits formed of basic cells.

6. A complementary metal-oxide semiconductor master slice integrated circuit as recited in claim 4 further comprising means for eliminating a requirement for electrical isolation regions between basic cells, said means for eliminating comprising separate gate means for each single T-channel MOS and for each single N-channel MOS forming a basic cell.

7. A complementary metal-oxide semiconductor master slice integrated circuit as recited in claim 4 further comprising means for providing to a basic cell a structure formed of a single P-channel MOS and a single N-channel MOS, said means for providing comprising a separate gate for each of said single N-channel and P-channel MOS devices, and further comprising:

biasing means for providing electrical bias to a specified complementary MOS pair of P-channel and N-channel MOS devices forming a single basic cell, thereby causing said complementary MOS pair of devices to provide isolation between adjacent cells, whereby electrical isolation regions are eliminated from the master slice integrated circuit.

* * * * *